United States Patent
Hori et al.

(10) Patent No.: US 9,546,437 B2
(45) Date of Patent: Jan. 17, 2017

(54) INGOT, SILICON CARBIDE SUBSTRATE, AND METHOD FOR PRODUCING INGOT

(71) Applicant: SUMITOMO ELECTRIC INDUSTRIES, LTD., Osaka-shi, Osaka (JP)

(72) Inventors: Tsutomu Hori, Itami (JP); Makoto Sasaki, Itami (JP); Tomohiro Kawase, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 14/173,037

(22) Filed: Feb. 5, 2014

(65) Prior Publication Data
US 2014/0295171 A1    Oct. 2, 2014

(30) Foreign Application Priority Data
Mar. 26, 2013    (JP) ................. 2013-064206

(51) Int. Cl.
*C30B 29/36* (2006.01)
*C30B 25/14* (2006.01)
*C30B 25/16* (2006.01)
*C30B 23/00* (2006.01)

(52) U.S. Cl.
CPC ............ *C30B 29/36* (2013.01); *C30B 23/002* (2013.01); *C30B 23/005* (2013.01); *C30B 25/14* (2013.01); *C30B 25/16* (2013.01); *C30B 25/165* (2013.01); *Y10T 428/26* (2015.01)

(58) Field of Classification Search
CPC ...... C30B 23/002; C30B 23/005; C30B 29/36; C30B 25/14; C30B 25/16; C30B 25/165
See application file for complete search history.

(56) References Cited

U.S. PATENT DOCUMENTS

| | | | | |
|---|---|---|---|---|
| 7,563,321 | B2 * | 7/2009 | Powell et al. | 117/84 |
| 7,855,385 | B2 * | 12/2010 | Kamiyama et al. | 257/77 |
| 2011/0206929 | A1 | 8/2011 | Nakabayashi et al. | |
| 2011/0266556 | A1 * | 11/2011 | Leonard et al. | 257/77 |
| 2012/0308758 | A1 | 12/2012 | Hori et al. | |

FOREIGN PATENT DOCUMENTS

| | | |
|---|---|---|
| JP | H09-157091 A | 6/1997 |
| JP | H10-182296 A | 7/1998 |
| JP | 2005-314217 A | 11/2005 |

(Continued)

OTHER PUBLICATIONS

Machine english translation of JP2007-320790 from the Espacenet website, internet retrieval date of Mar. 8, 2016.*

(Continued)

*Primary Examiner* — Jonathan Langman
(74) *Attorney, Agent, or Firm* — Drinker Biddle & Reath LLP

(57) ABSTRACT

An ingot in which generation of crack is sufficiently suppressed is obtained. The ingot includes: a seed substrate formed of silicon carbide; and a silicon carbide layer grown on the seed substrate and containing nitrogen atoms. The silicon carbide layer has a thickness of 15 mm or more in a growth direction. In the silicon carbide layer, a concentration gradient of the nitrogen atoms in the growth direction is $5 \times 10^{17}$ atoms/cm$^4$ or less.

7 Claims, 3 Drawing Sheets

(56) References Cited

FOREIGN PATENT DOCUMENTS

| | | | | |
|---|---|---|---|---|
| JP | 2007-320790 | * | 12/2007 | ............. C30B 29/36 |
| JP | 2010-095397 A | | 4/2010 | |
| JP | 2012-250864 A | | 12/2012 | |

OTHER PUBLICATIONS

Notice of Grounds of Rejection mailed Jun. 21, 2016 in Japanese Patent Application No. 2013-064206 (2 pages) with an English Translation (3 pages).
Notice of Grounds of Rejection issued Nov. 8, 2016 in Japanese Patent Application No. 2013-064206 (2 pages) with an English Translation (3 pages).

* cited by examiner

INGOT, SILICON CARBIDE SUBSTRATE, AND METHOD FOR PRODUCING INGOT

BACKGROUND OF THE INVENTION

Field of the Invention

The present invention relates to an ingot, a silicon carbide substrate, and a method for producing the ingot, more particularly, an ingot formed of silicon carbide, an silicon carbide substrate obtained from the ingot, and a method for producing the ingot formed of silicon carbide.

Description of the Background Art

In recent years, in order to achieve high breakdown voltage, low loss, and the like in a semiconductor device, silicon carbide has begun to be adopted as a material for the semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like.

A silicon carbide ingot is produced by, for example, growing a silicon carbide single crystal on a seed substrate using a sublimation-recrystallization method. In the grown crystal of this silicon carbide ingot, stress, strain, and the like are generated. They may cause generation of crack in the ingot or a silicon carbide substrate obtained by cutting the ingot. To address this, Japanese Patent Laying-Open No. 2012-250864 discloses to relax stress or strain in a crystal by reducing a concentration gradient of metal atoms in a growth direction of an ingot, for example.

In Japanese Patent Laying-Open No. 2012-250864 described above, the stress or strain in the crystal can be relaxed to some extent, but it is difficult to sufficiently suppress generation of crack in the ingot and the silicon carbide substrate obtained by cutting the ingot.

SUMMARY OF THE INVENTION

The present invention has been made in view of the foregoing problem, and has an object to provide an ingot in which generation of crack is suppressed, a silicon carbide substrate obtained by cutting the ingot, and a method for producing the ingot by which the generation of crack can be suppressed.

An ingot according to the present invention includes: a seed substrate formed of silicon carbide; and a silicon carbide layer grown on the seed substrate and containing nitrogen atoms. The silicon carbide layer has a thickness of 15 mm or more in a growth direction. In the silicon carbide layer, a concentration gradient of the nitrogen atoms in the growth direction is $5 \times 10^{17}$ atoms/cm$^4$ or less.

The present inventors have conducted a detailed analysis on a scheme for suppressing generation of crack in a silicon carbide ingot obtained by growing a silicon carbide layer containing nitrogen atoms on a seed substrate. As a result, the present inventors have found that when the thickness of the silicon carbide layer in the growth direction is large (for example, 15 mm or more), a distribution of the concentration of the nitrogen atoms in the growth direction becomes large, with the result that stress or strain is generated in the crystal to facilitate generation of crack in the ingot. Accordingly, the present inventors have arrived at the present invention.

In the ingot according to the present invention, the thickness of the silicon carbide layer in the growth direction is large, i.e., 15 mm or more. Moreover, the concentration gradient of the nitrogen atoms in the growth direction in the silicon carbide layer is reduced to $5 \times 10^{17}$ atoms/cm$^4$ or less. Hence, in this ingot, strain or stress resulting from the distribution of the concentration of the nitrogen atoms is relaxed in the crystal, thereby suppressing generation of crack. Thus, according to the ingot in the present invention, there can be provided an ingot in which generation of crack is suppressed. It should be noted that in the present invention, the "concentration gradient of the nitrogen atoms in the growth direction" is defined as described in the below-described embodiment of the present invention.

In the ingot, the concentration gradient of the nitrogen atoms in the growth direction may be $3 \times 10^{17}$ atoms/cm$^4$ or less or $1 \times 10^{17}$ atoms/cm$^4$ or less in the silicon carbide layer. Accordingly, the strain or stress in the crystal is more relaxed, thereby obtaining an ingot in which generation of crack is suppressed more.

In the ingot, the silicon carbide layer may have a thickness of 20 mm or more in the growth direction. When the thickness of the silicon carbide layer in the growth direction is large, crack is more likely to be generated in the ingot. Hence, when the thickness of the silicon carbide layer in the growth direction is larger, i.e., 20 mm, the ingot according to the present invention can be suitably employed in which the generation of crack is suppressed.

When viewed in the growth direction, the ingot may have a width of 100 mm or more. In this way, a silicon carbide ingot having a large diameter can be obtained. By cutting such a silicon carbide ingot, a silicon carbide substrate having a large diameter can be obtained.

The ingot may have a polytype of 4H type. Thus, the ingot may have a polytype of 4H type, which is a representative polytype of silicon carbide.

The silicon carbide substrate according to the present invention is obtained by cutting the ingot according to the present invention in which the generation of crack is suppressed. Thus, according to the silicon carbide substrate in the present invention, there can be provided a high-quality silicon carbide substrate in which generation of crack is suppressed.

A method for producing an ingot in the present invention includes the steps of: preparing a seed substrate and a source material each formed of silicon carbide; and growing a silicon carbide layer containing nitrogen atoms on the seed substrate by sublimating the source material while supplying nitrogen gas and carrier gas. In the step of growing the silicon carbide layer, at least one of flow rates of the carrier gas and the nitrogen gas is changed to satisfy a Formula (1):

$$0.6 < \frac{G(t_1)C(t_1)/N(t_1)}{G(t_2)C(t_2)/N(t_2)} < 2 \qquad \text{Formula (1)}$$

where $G(t_1)$, $G(t_2)$ represent growth rates of the silicon carbide layer at times $t_1$, $t_2$ during the growth of the silicon carbide layer, $C(t_1)$, $C(t_2)$ represent flow rates of the carrier gas at the times $t_1$, $t_2$ during the growth of the silicon carbide layer, $N(t_1)$, $N(t_2)$ represent flow rates of the nitrogen gas at the times $t_1$, $t_2$ during the growth of the silicon carbide layer.

According to the analysis conducted by the present inventors, when growing the silicon carbide layer on the seed substrate using the sublimation-recrystallization method, the growth rate of the silicon carbide layer is changed as the crystal growth progresses. Hence, it is conventionally difficult to satisfy the relation of Formula (1) during a period of time from the start to completion of the growth of the silicon carbide layer. Accordingly, a distribution of the concentration of the nitrogen atoms becomes large in the growth direction of the ingot, with the result that crack is likely to be generated in the produced ingot.

To address this, in the method for producing the ingot according to the present invention, the flow rate of one of the carrier gas and the nitrogen gas is changed to satisfy the relation of Formula (1) when the growth rate of the silicon carbide layer is changed due to the progress of the crystal growth. Accordingly, the concentration gradient of the nitrogen atoms in the growth direction of the ingot is further reduced, thereby suppressing the generation of crack. Thus, according to the method for producing the ingot in the present invention, there can be produced an ingot in which generation of crack is suppressed.

In the method for producing the ingot, the flow rate of the nitrogen gas is preferably changed to satisfy the Formula (1). Accordingly, as compared with a case of changing the flow rate of the carrier gas, the gas flow rate is adjusted readily to satisfy Formula (1).

As apparent from the description above, according to the ingot in the present invention, there can be provided an ingot in which generation of crack is suppressed. Further, according to the silicon carbide substrate in the present invention, there can be provided a high-quality silicon carbide substrate in which generation of crack is suppressed. Furthermore, according to the method for producing the ingot in the present invention, there can be produced an ingot in which generation of crack is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
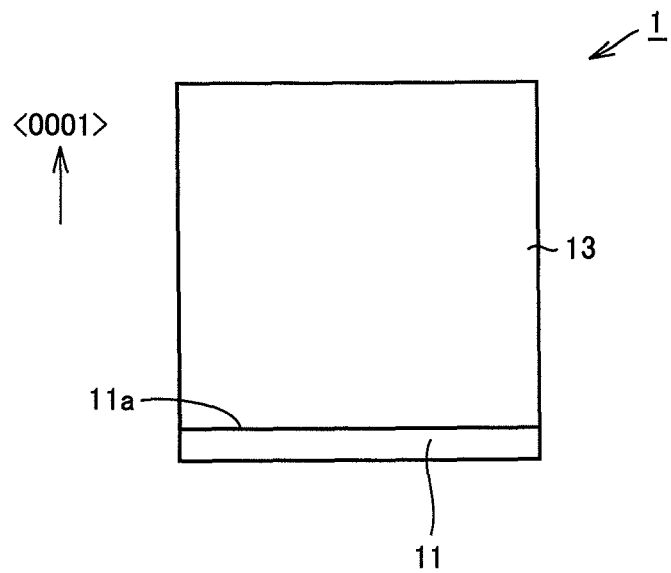
FIG. 1 is a schematic front view showing an ingot according to the present embodiment.

The following describes an embodiment of the present invention with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

Figure 2:
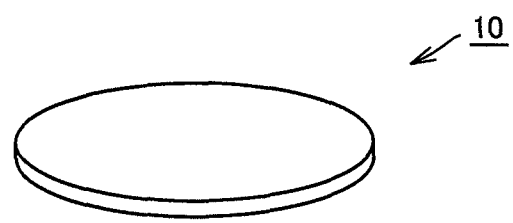
FIG. 2 is a schematic perspective view showing a silicon carbide substrate according to the present embodiment.

Described first are an ingot and a silicon carbide substrate in one embodiment of the present invention. Referring to FIG. 1, an ingot 1 according to the present embodiment is formed of silicon carbide having a polytype of 4H type, and includes a seed substrate 11 and a silicon carbide layer 13. Silicon carbide layer 13 contains nitrogen (N) atoms, and is formed by being grown on a surface 11a of seed substrate 11 in a <0001> direction using the sublimation-recrystallization method. Hence, the growth direction of silicon carbide layer 13 corresponds to the <0001> direction. Referring to FIG. 2, a silicon carbide substrate 10 according to the present embodiment is obtained by cutting ingot 1 (see FIG. 1) in an appropriate direction.

Referring to FIG. 1, the thickness of silicon carbide layer 13 in the <0001> direction may be 15 mm or more, 20 mm or more, or 20 mm or more, and 50 mm or less. The thickness of ingot 1 in the <0001> direction may be 15 mm, 20 mm, or 50 mm, for example.

The width (diameter) of ingot 1 when viewed in the <0001> direction is 100 mm or more. The width thereof may be 100 mm, 125 mm, 150 mm, or 175 mm, for example.

Silicon carbide layer 13 contains the nitrogen (N) atoms, which are an n type impurity. Silicon carbide layer 13 contains the nitrogen atoms at a concentration of, for example, $3 \times 10^{18}$ atoms/cm$^3$ or more and $2 \times 10^{19}$ atoms/cm$^3$ or less. Further, in silicon carbide layer 13, a concentration gradient of the nitrogen atoms in the <0001> direction is $5 \times 10^{17}$ atoms/cm$^4$ or less, preferably $3 \times 10^{17}$ atoms/cm$^4$ or less, more preferably, $1 \times 10^{17}$ atoms/cm$^4$ or less.

Figure 3:
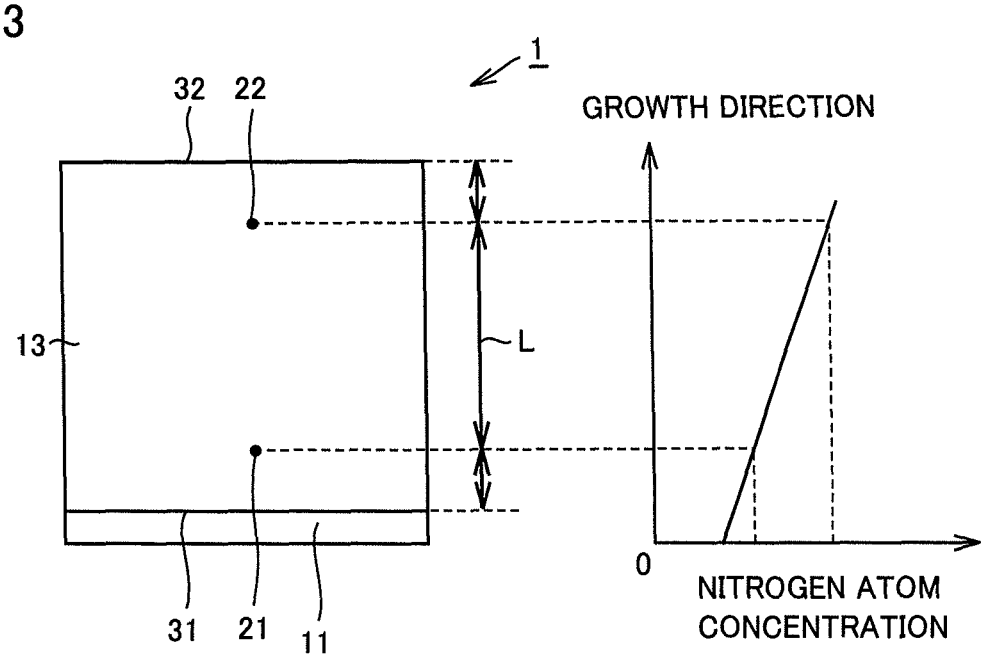
FIG. 3 is a schematic view for illustrating a method for calculating a concentration gradient of nitrogen atoms in a growth direction of the ingot according to the present embodiment.

In silicon carbide layer 13, the "concentration gradient of the nitrogen atoms in the growth direction" can be calculated in the following manner. Referring to FIG. 3, first, it is assumed that a first measurement point 21 represents a point away from a main surface 31 of silicon carbide layer 13 at the seed substrate 11 side by 5 mm in the growth direction, and a second measurement point 22 represents a point away from a main surface 32 of silicon carbide layer 13 by 5 mm in the growth direction. As shown in FIG. 3, first measurement point 21 and second measurement point 22 include a central portion in the radial direction of silicon carbide layer 13. Next, in each of first measurement point 21 and second measurement point 22, the nitrogen atom concentration (atoms/cm$^3$) is measured. Then, the value (absolute value) of a difference (atoms/cm$^3$) between the nitrogen atom concentration in first measurement point 21 and the nitrogen atom concentration in second measurement point 22 is divided by a distance L (cm) between first measurement point 21 and second measurement point 22. In this way, the value of the "concentration gradient of the nitrogen atoms in the growth direction" in silicon carbide layer 13 can be calculated. In ingot 1 according to the present embodiment, the "concentration gradient of the nitrogen atoms in the growth direction" as calculated in the above-described manner is $5 \times 10^{17}$ atoms/cm$^4$ or less. As shown in FIG. 3, the nitrogen atom concentration may be linearly changed to have a certain slope or may be changed to have a plurality of slopes in the growth direction from the main surface 31 side to the main surface 32 side.

As described above, in ingot 1 according to the present embodiment, the thickness of silicon carbide layer 13 in the growth direction is large, i.e., 15 mm or more. Moreover, the concentration gradient of the nitrogen atoms in the growth direction is reduced to $5 \times 10^{17}$ atoms/cm$^4$ or less in silicon carbide layer 13. Accordingly, in this ingot 1, strain or stress resulting from a distribution of the concentration of the nitrogen atoms is relaxed in the crystal, thereby suppressing generation of crack. Thus, ingot 1 according to the present embodiment is an ingot in which the generation of crack is suppressed.

Further, silicon carbide substrate 10 according to the present embodiment is obtained by cutting ingot 1 according to the present embodiment in which the generation of crack is suppressed. Hence, silicon carbide substrate 10 according to the present embodiment is a high-quality silicon carbide substrate in which generation of crack is suppressed.

The following describes a method for producing the ingot according to the present embodiment. In the method for producing the ingot according to the present embodiment, ingot 1 according to the present embodiment is produced which is formed of silicon carbide and contains the nitrogen atoms.

Figure 4:
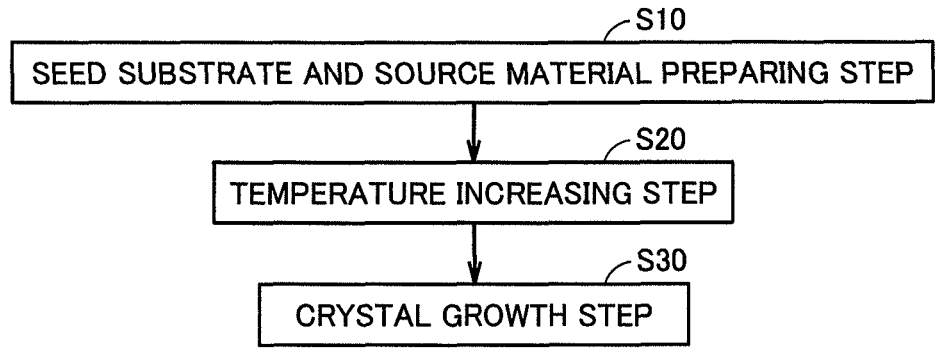
FIG. 4 is a flowchart schematically showing a method for producing the ingot according to the present embodiment.
Figure 5:
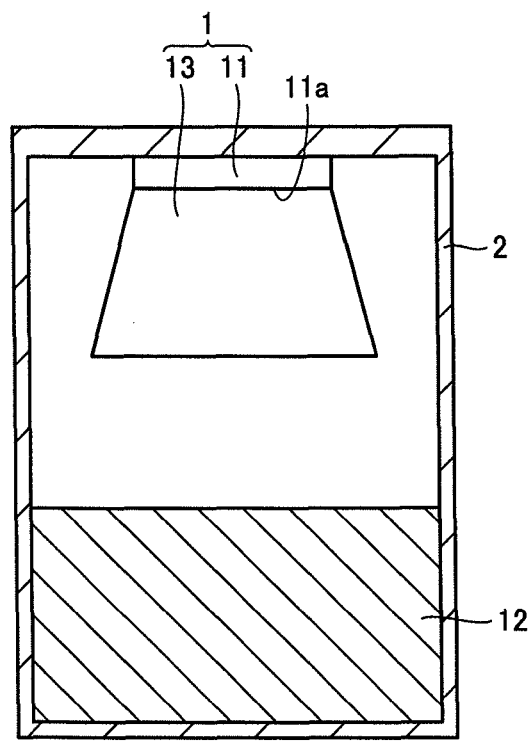
FIG. 5 is a schematic cross sectional view for illustrating the method for producing the ingot according to the present embodiment.

Referring to FIG. 4, a seed substrate and source material preparing step is first performed as a step (S10) in the method for producing the ingot according to the present embodiment. In this step (S10), referring to FIG. 5, seed substrate 11 formed of a silicon carbide single crystal and a source material 12 formed of polycrystal silicon carbide powders or a silicon carbide sintered compact are first prepared. Seed substrate 11 and source material 12 are placed face to face with each other in a crucible 2 formed of carbon as shown in FIG. 5.

Next, a temperature increasing step is performed as a step (S20). In this step (S20), referring to FIG. 5, first, argon (Ar) gas, which is a carrier gas, is supplied into crucible 2. Then, the inside of crucible 2 is heated using a heating coil (not shown) or the like to a temperature of, for example, 2000° C. or more and 2500° C. or less. In doing so, the inside of crucible 2 is heated such that the temperature becomes smaller in a direction from the source material 12 side to the seed substrate 11 side (such that a temperature gradient is formed).

Next, as a step (S30), a crystal growth step is performed. In this step (S30), while supplying argon gas, pressure in crucible 2 is reduced to a predetermined pressure. In this way, source material 12 is sublimated to generate source material gas of silicon carbide, and the source material gas is crystallized on seed substrate 11, thereby growing silicon carbide layer 13. Further, in this step (S30), nitrogen gas, which is a dopant gas, is supplied into crucible 2 together with the argon gas. Then, the nitrogen gas is thermally decomposed and resultant nitrogen atoms are incorporated as a dopant into silicon carbide layer 13, which is growing. Thus, in step (S30), source material 12 is sublimated while supplying the nitrogen gas and the argon gas, whereby silicon carbide layer 13 containing the nitrogen atoms is grown on seed substrate 11.

In this step (S30), a flow rate of at least one of the argon gas and the nitrogen gas is changed to satisfy the below-described Formula (1), where $G(t_1)$, $G(t_2)$ (mm/h) represent growth rates of silicon carbide layer 13 at appropriate times $t_1$, $t_2$ during the growth of silicon carbide layer 13, $C(t_1)$, $C(t_2)$ (Pa·m$^3$/s) represent flow rates of the argon gas at appropriate times $t_1$, $t_2$ during the growth of silicon carbide layer 13, and $N(t_1)$, $N(t_2)$ (Pa·m$^3$/s) represent flow rates of the nitrogen gas at appropriate times $t_1$, $t_2$ during the growth of silicon carbide layer 13. In addition, in this step (S30), the flow rate of at least one of the argon gas and the nitrogen gas is preferably changed to satisfy the below-described Formula (2). Further, in this step (S30), the flow rate of the nitrogen gas is preferably changed (decreased) to satisfy Formula (1) or Formula (2) in order to address decrease of the growth rate of silicon carbide layer 13 due to consumption of source material 12 as the crystal growth of silicon carbide layer 13 progresses. Accordingly, as compared with a case of changing the flow rate of the argon gas, the gas flow rate is adjusted more readily to satisfy Formula (1) or Formula (2).

$$0.6 < \frac{G(t_1)C(t_1)/N(t_1)}{G(t_2)C(t_2)/N(t_2)} < 2 \qquad \text{Formula (1)}$$

$$0.9 < \frac{G(t_1)C(t_1)/N(t_1)}{G(t_2)C(t_2)/N(t_2)} < 1.1 \qquad \text{Formula (2)}$$

Figure 6:
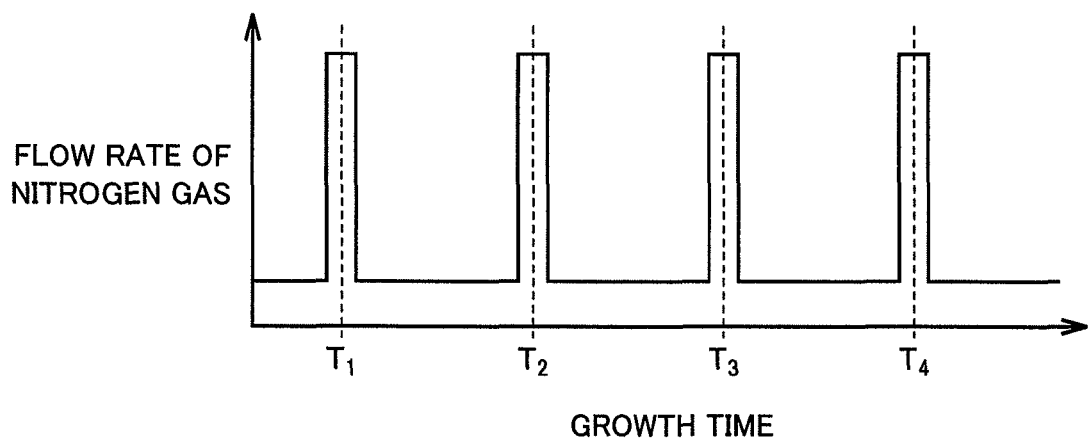
FIG. 6 is a graph for illustrating a method for calculating a growth rate of a silicon carbide layer in the method for producing the ingot according to the present embodiment.
Figure 7:
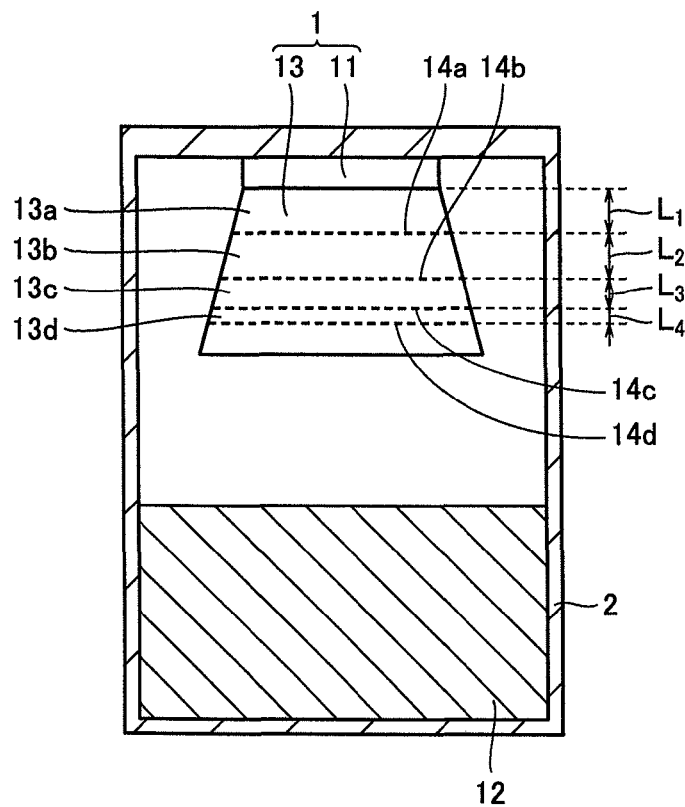
FIG. 7 is a schematic cross sectional view for illustrating a method for calculating the growth rate of the silicon carbide layer in the method for producing the ingot according to the present embodiment.

The growth rate of silicon carbide layer 13 can be measured in the following manner. FIG. 6 is a graph showing a change of the flow rate of the nitrogen gas during the growth of silicon carbide layer 13. The horizontal axis represents growth time, whereas the vertical axis represents the flow rate of the nitrogen gas. Referring to FIG. 6, silicon carbide layer 13 is grown while increasing the flow rate of the nitrogen gas at predetermined times ($T_1$, $T_2$, $T_3$, $T_4$) in the form of pulse. In this way, as shown in FIG. 7, high-concentration nitrogen regions 14a, 14b, 14c, 14d each having a relatively high nitrogen atom concentration are formed at predetermined intervals in the growth direction of ingot 1. Further, high-concentration nitrogen regions 14a, 14b, 14c, 14d look darker than the other regions in silicon carbide layer 13. Accordingly, from the appearance of silicon carbide layer 13 having grown, it is possible to measure: a length $L_1$ of a first region 13a of silicon carbide layer 13 in the growth direction; a length $L_2$ of a second region 13b thereof in the growth direction; a length $L_3$ of a third region 13c thereof in the growth direction; and a length $L_4$ of a fourth region 13d thereof in the growth direction. Accordingly, in accordance with Formulae (3) to (6) described below, it is possible to calculate: a growth rate $G_1$ in first region 13a; a growth rate $G_2$ in second region 13b; a growth rate $G_3$ in third region 13c; and a growth rate $G_4$ in fourth region 13d.

$$G_1 = \frac{L_1}{T_1} \qquad \text{Formula (3)}$$

$$G_2 = \frac{L_2}{T_2 - T_1} \qquad \text{Formula (4)}$$

$$G_3 = \frac{L_3}{T_3 - T_2} \qquad \text{Formula (5)}$$

$$G_4 = \frac{L_4}{T_4 - T_2} \qquad \text{Formula (6)}$$

In this way, the above-described steps (S10) to (S30) are performed to produce ingot 1 according to the present embodiment (see FIG. 1), thus completing the method for producing the ingot according to the present embodiment. By cutting ingot 1 thus produced, silicon carbide substrate 10 according to the present embodiment can be obtained (see FIG. 2).

As described above, in the method for producing the ingot according to the present embodiment, in crystal growth step (S30), the flow rate of the nitrogen gas is changed to satisfy the relation of Formula (1) or Formula (2) described above when the growth rate of silicon carbide layer 13 is decreased due to the progress of the crystal growth. More specifically, when the growth rate of silicon carbide layer 13 is decreased, the flow rate of the nitrogen gas is decreased. In this way, there can be produced ingot 1 according to the present embodiment in which the concentration gradient of the nitrogen atoms in the growth direction is small and the generation of crack is suppressed.

EXAMPLES

An experiment was conducted to confirm the effect of the present invention regarding the suppression of generation of crack or breakage in the ingot or the silicon carbide substrate. Referring to FIG. 5, in accordance with the above-described method for producing the ingot according to the present embodiment, ingots 1 were produced by growing silicon carbide layers 13 on seed substrates 11. In doing so, the flow rates of the nitrogen gas and the argon gas were changed during the growth of silicon carbide layers 13. Further, the growth rate of each silicon carbide layer 13 after 1 hour from the start of the growth was 0.8 (mm/h). The growth rate after 25 hours therefrom was 0.4 (mm/h). Further, in each ingot 1, silicon carbide layer 13 had a thickness of 20 mm and had a diameter of 100 mm.

Example 1

In an Example 1, flow rate $N(t_1)$ of the nitrogen gas after 1 hour from the start of the growth (time $t_1$) was set at $5.0\times10^{-2}$ (Pa·m$^3$/s), flow rate $C(t_1)$ of the argon gas after 1 hour from the start of the growth (time $t_1$) was set at $1.7\times10^{-1}$ (Pa·m$^3$/s). Flow rate $N(t_2)$ of the nitrogen gas after 25 hours therefrom (time $t_2$) was set at $2.5\times10^{-2}$ (Pa·m$^3$/s), and flow rate $C(t_2)$ of the argon gas after 25 hours therefrom (time $t_2$) was set at $1.7\times10^{-1}$ (Pa·m$^3$/s). Accordingly, in Example 1, the value of $\{G(t_1)C(t_1)/N(t_1)\}/\{G(t_2)C(t_2)/N(t_2)\}$ was 1.

Example 2

In an Example 2, flow rate $N(t_1)$ of the nitrogen gas after 1 hour from the start of the growth (time $t_1$) was set at $5.0\times10^{-2}$ (Pa·m$^3$/s), and flow rate $C(t_1)$ of the argon gas after 1 hour from the start of the growth (time $t_1$) was set at $1.7\times10^{-1}$ (Pa·m$^3$/s). Flow rate $N(t_2)$ of the nitrogen gas after 25 hours therefrom (time $t_2$) was set at $5.0\times10^{-2}$ (Pa·m$^3$/s), and flow rate $C(t_2)$ of the argon gas after 25 hours therefrom (time $t_2$) was set at $3.4\times10^{-1}$ (Pa·m$^3$/s). Accordingly, in Example 2, the value of $\{G(t_1)C(t_1)/N(t_1)\}/\{G(t_2)C(t_2)/N(t_2)\}$ was the same as the value in Example 1, i.e., was 1.

Comparative Example

In a Comparative Example, flow rate $N(t_1)$ of the nitrogen gas after 1 hour from the start of the growth (time $t_1$) was set at $5.0\times10^{-2}$ (Pa·m$^3$/s), and flow rate $C(t_1)$ of the argon gas after 1 hour from the start of the growth (time $t_1$) was set at $1.7\times10^{-1}$ (Pa·m$^3$/s). Flow rate $N(t_2)$ of the nitrogen gas after 25 hours therefrom (time $t_2$) was set at $5.0\times10^{-2}$ (Pa·m$^3$/s), and flow rate $C(t_2)$ of the argon gas was set at $1.7\times10^{-1}$ (Pa·m$^3$/s). Hence, in the Comparative Example, the value of $\{G(t_1)C(t_1)/N(t_1)\}/\{G(t_2)C(t_2)/N(t_2)\}$ was ½.

Referring to FIG. 3, in each of the ingots obtained in Examples 1 and 2 as well as the Comparative Example, the nitrogen atom concentrations were measured at first measurement point 21 (point away from main surface 31 by 5 mm) and second measurement point 22 (point away from main surface 32 by 5 mm). Then, the value (absolute value) of a difference between the nitrogen atom concentrations was divided by the distance (10 mm) between first measurement point 21 and second measurement point 22, thereby calculating a value of the concentration gradient of the nitrogen atoms in the growth direction. Further, a silicon carbide substrate was obtained by cutting each of the produced ingots. The silicon carbide substrate was subjected to external impact to check whether or not breakage took place.

As a result of the experiment described above, in the Comparative Example, the concentration gradient of the nitrogen atoms was large, specifically, $16\times10^{17}$ atoms/cm$^4$, whereas the concentration gradient of the nitrogen atoms in each of Examples 1 and 2 was reduced to $1\times10^{17}$/cm$^4$. Further, in the Comparative Example, no crack or the like was generated in the ingot, but when cutting the ingot to obtain a silicon carbide substrate, crack was generated. Thus, it was difficult to obtain a normal silicon carbide substrate. In contrast, in each of Examples 1 and 2, it is seen that no breakage took place even under application of external impact on a silicon carbide substrate obtained therefrom by cutting.

Next, an experiment was conducted to confirm the effect of the present invention regarding the generation of crack in the ingot more in detail. First, according to the method for producing the ingot in the present embodiment, ingots 1 were produced by growing silicon carbide layers 13 on seed substrates 11 (see FIG. 5). In doing so, the flow rates of the nitrogen gas and the argon gas were changed during the growth of silicon carbide layers 13. Further, in ingots 1, silicon carbide layers 13 had thicknesses of 15 mm and 50 mm and had diameters of 100 mm, 125 mm, and 150 mm. For each of obtained ingots 1, the concentration gradient of the nitrogen atoms in the growth direction in silicon carbide layer 13 was calculated and existence/non-existence of generated crack was checked. Results thereof are shown in Table 1. It should be noted that the existence/non-existence of the generated crack was checked by dropping an iron ball having a weight of 500 g onto a facet portion of the ingot from a height of 50 cm. When crack was generated, "Exist" is indicated in Table 1. When no crack was generated, "Not Exist" is indicated therein.

TABLE 1

| Diameter (mm) | Thickness (mm) | $\{G(t_1)\cdot C(t_1)/N(t_1)\}/\{G(t_2)\cdot C(t_2)/N(t_2)\}$ (Minimum Value) | $\{G(t_1)\cdot C(t_1)/N(t_1)\}/\{G(t_2)\cdot C(t_2)/N(t_2)\}$ (Maximum Value) | Concentration Gradient of Nitrogen Atoms (Maximum Value) (Atoms/cm$^4$) | Generation of Crack |
|---|---|---|---|---|---|
| 100 | 15 | 1 | 1.9 | $4.8\times10^{17}$ | Not Exist |
| 125 | 15 | 1 | 1.9 | $4.6\times10^{17}$ | Not Exist |
| 150 | 15 | 1 | 1.9 | $4.7\times10^{17}$ | Not Exist |
| 100 | 50 | 1 | 1.9 | $4.7\times10^{17}$ | Not Exist |
| 100 | 50 | 1 | 1.5 | $2.9\times10^{17}$ | Not Exist |

TABLE 1-continued

| Diameter (mm) | Thickness (mm) | $\{G(t_1)\cdot C(t_1)/N(t_1)\}/$ $\{G(t_2)\cdot C(t_2)/N(t_2)\}$ (Minimum Value) | $\{G(t_1)\cdot C(t_1)/N(t_1)\}/$ $\{G(t_2)\cdot C(t_2)/N(t_2)\}$ (Maximum Value) | Concentration Gradient of Nitrogen Atoms (Maximum Value) (Atoms/cm$^4$) | Generation of Crack |
|---|---|---|---|---|---|
| 100 | 50 | 1 | 1.2 | $0.8 \times 10^{17}$ | Not Exist |
| 100 | 15 | 1.5 | 2.5 | $7.0 \times 10^{17}$ | Exist |
| 100 | 50 | 1 | 1.9 | $4.9 \times 10^{17}$ | Not Exist |
| 100 | 50 | 1.5 | 2.5 | $7.0 \times 10^{17}$ | Exist |

As shown in Table 1, when the value of $\{G(t_1)C(t_1)/N(t_1)\}/\{G(t_2)C(t_2)/N(t_2)\}$ was in a range of more than 0.6 and less than 2, the concentration gradient of the nitrogen atoms in silicon carbide layer 13 was $5\times10^{17}$ atoms/cm$^4$ or less. In this case, it was seen that no crack was generated. On the other hand, when the value of $\{G(t_1)C(t_1)/N(t_1)\}/\{G(t_2)C(t_2)/N(t_2)\}$ was out of the range of more than 0.6 and less than 2, the concentration gradient of the nitrogen atoms in silicon carbide layer 13 was more than $5\times10^{17}$ atoms/cm$^4$. In this case, it was seen that crack was generated. As a result, it was found that by performing the crystal growth under the condition that the value of $\{G(t_1)C(t_1)/N(t_1)\}/\{G(t_2)C(t_2)/N(t_2)\}$ was in the range of more than 0.6 and less than 2, the concentration gradient of the nitrogen atoms in the growth direction was made small in the silicon carbide layer, with the result that generation of crack was suppressed in the ingot.

The ingot, the silicon carbide substrate, and the method for producing the ingot in the present invention can be particularly advantageously applied to an ingot, a silicon carbide substrate, and a method for producing the ingot, each of which is required to achieve suppression of generation of crack.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An ingot comprising:
   a seed substrate formed of silicon carbide;
   a silicon carbide layer grown on said seed substrate and containing nitrogen atoms,
   said silicon carbide layer having a thickness of 15 mm or more in a growth direction,
   in said silicon carbide layer, a concentration gradient of said nitrogen atoms in said growth direction being $5\times10^{17}$ atoms/cm$^4$ or less;
   wherein in said silicon carbide layer, a concentration of nitrogen atoms is $3\times10^{18}$ atoms/cm$^3$ or more and $2\times10^{19}$ atoms/cm$^3$ or less, and
   wherein the concentration of nitrogen linearly increases in the growth direction of the ingot.

2. The ingot according to claim 1, wherein when viewed in said growth direction, the ingot has a width of 100 mm or more.

3. The ingot according to claim 1, wherein the ingot has a polytype of 4H type.

4. The ingot according to claim 1, wherein in said silicon carbide layer,
   said concentration gradient of said nitrogen atoms in said growth direction is $0.8\times10^{17}$ atoms/cm$^4$ or more.

5. The ingot according to claim 1, wherein said concentration gradient of said nitrogen atoms is calculated by dividing the value of a difference between the nitrogen atom concentration in a first measurement point and the nitrogen atom concentration in a second measurement point, by a distance between said first measurement point and said second measurement point,
   said first measurement point representing a point away from one main surface of said silicon carbide layer by 5 mm in said growth direction, and said second measurement point representing a point away from the other main surface of said silicon carbide layer by 5 mm in said growth direction.

6. A method for producing an ingot, according to claim 1 comprising the steps of:
   preparing a seed substrate and a source material each formed of silicon carbide; and
   growing a silicon carbide layer containing nitrogen atoms on said seed substrate by sublimating said source material while supplying nitrogen gas and carrier gas,
   in the step of growing said silicon carbide layer, at least one of flow rates of said carrier gas and said nitrogen gas being changed to satisfy a Formula (1):

$$0.6 < \frac{G(t_1)C(t_1)/N(t_1)}{G(t_2)C(t_2)/N(t_2)} < 2 \qquad \text{Formula (1)}$$

where G(t1), G(t2) represent growth rates of said silicon carbide layer at times t1, t2 during the growth of said silicon carbide layer, C(t1), C(t2) represent flow rates of said carrier gas at the times t1, t2 during the growth of said silicon carbide layer, N(t1), N(t2) represent flow rates of said nitrogen gas at the times t1, t2 during the growth of said silicon carbide layer.

7. The method for producing the ingot according to claim 6, wherein the flow rate of said nitrogen gas is changed to satisfy the Formula (1).

* * * * *